(12) United States Patent
Ishizaki

(10) Patent No.: US 10,512,163 B2
(45) Date of Patent: Dec. 17, 2019

(54) ELECTRONIC COMPONENT MOUNTING BOARD

(71) Applicant: TDK CORPORATION, Tokyo (JP)

(72) Inventor: Kazuo Ishizaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/467,848

(22) Filed: Mar. 23, 2017

(65) Prior Publication Data

US 2017/0290152 A1 Oct. 5, 2017

(30) Foreign Application Priority Data

Mar. 30, 2016 (JP) ................. 2016-068796

(51) Int. Cl.
| | | |
|---|---|---|
| H05K 7/10 | (2006.01) |
| H05K 7/12 | (2006.01) |
| H05K 1/11 | (2006.01) |
| H05K 1/18 | (2006.01) |
| H05K 1/02 | (2006.01) |

(52) U.S. Cl.
CPC ........... *H05K 1/112* (2013.01); *H05K 1/0216* (2013.01); *H05K 1/181* (2013.01); *H05K 1/183* (2013.01); *H05K 2201/0715* (2013.01); *H05K 2201/1053* (2013.01); *H05K 2201/10515* (2013.01); *Y02P 70/611* (2015.11)

(58) Field of Classification Search
CPC ...... H05K 1/0216; H05K 1/112; H05K 1/181; H05K 1/183; H05K 2201/0715; H05K 2201/10515; H05K 2201/1053; Y02P 70/611

USPC ................................................. 361/768, 760
See application file for complete search history.

(56) References Cited

U.S. PATENT DOCUMENTS

| | | | | |
|---|---|---|---|---|
| 5,808,878 A | * | 9/1998 | Saito ................... | H01L 23/552 257/659 |
| 8,748,229 B2 | * | 6/2014 | Nishimura ............ | H01L 21/568 257/686 |
| 2003/0116843 A1 | * | 6/2003 | Iijima ................ | H01L 23/49822 257/700 |
| 2009/0188703 A1 | | 7/2009 | Ito et al. | |
| 2010/0214746 A1 | * | 8/2010 | Lotfi ................... | H01F 27/2804 361/728 |
| 2011/0050191 A1 | * | 3/2011 | Tsuji ................... | H01F 17/0006 323/282 |
| 2014/0262477 A1 | * | 9/2014 | Booth .................... | H05K 1/183 174/388 |

(Continued)

FOREIGN PATENT DOCUMENTS

| | | |
|---|---|---|
| JP | 2003-197809 A | 7/2003 |
| JP | 2006/073677 A | 3/2006 |
| WO | 2009/093343 A1 | 7/2009 |

*Primary Examiner* — Yuriy Semenenko
(74) *Attorney, Agent, or Firm* — Oliff PLC

(57) ABSTRACT

An electronic component mounting board includes: a circuit board having a wiring layer; a pocket part provided on a main surface of one side of the circuit board; a passive component housed in the pocket part; an active component arranged above the passive component and the main surface of the one side of the circuit board and connected to the passive component; and a shield layer formed of a material containing a magnetic material and provided between a bottom surface of the pocket part and a lower surface of the passive component.

5 Claims, 6 Drawing Sheets

(56) References Cited

U.S. PATENT DOCUMENTS

2015/0062989 A1* 3/2015 Su .................. H05K 1/0373
363/123
2015/0302974 A1* 10/2015 Zhao .................. H01F 17/0013
361/270

* cited by examiner

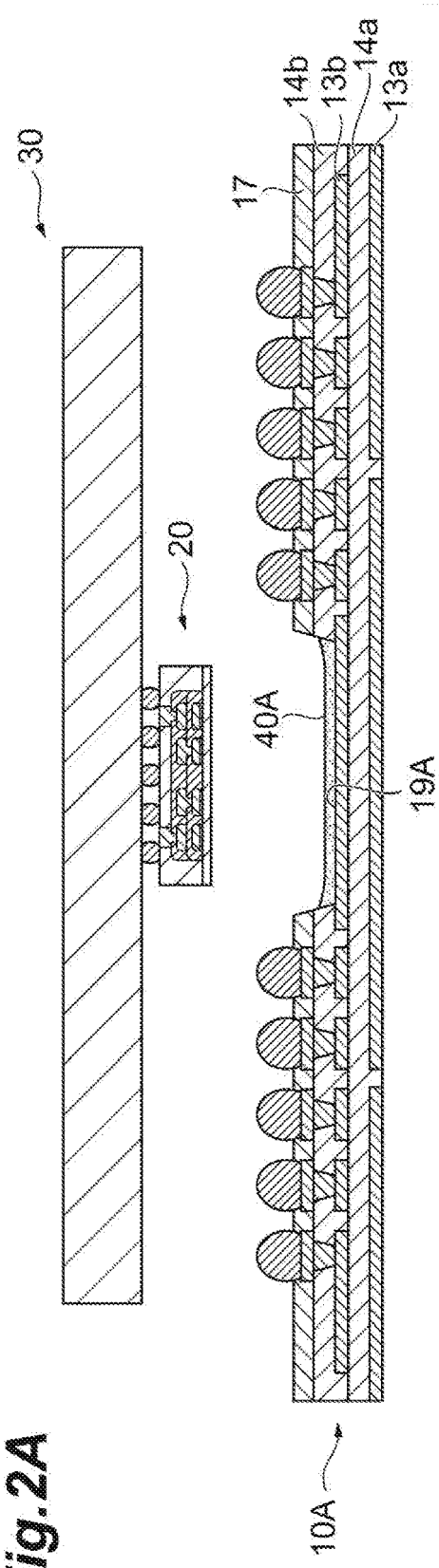
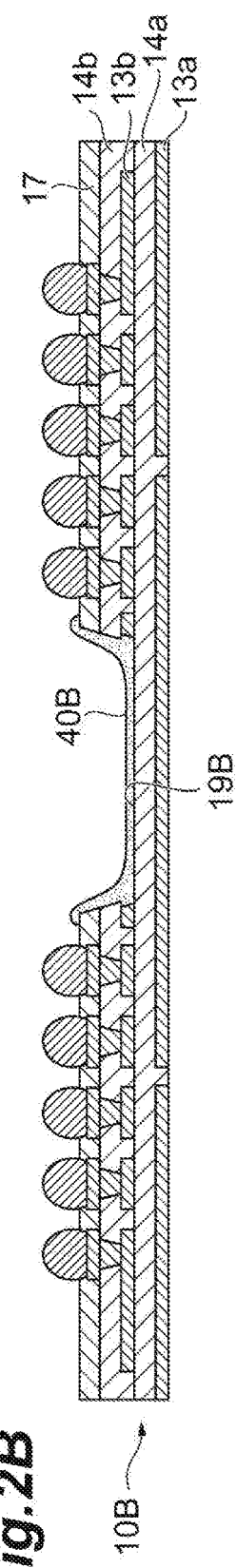
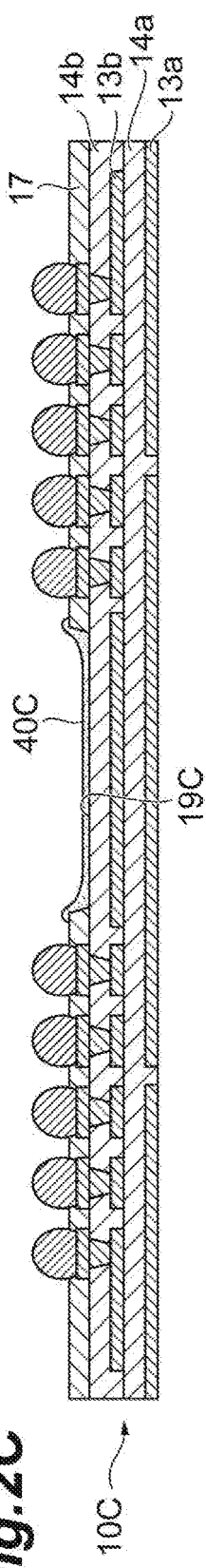
Fig.2A
Fig.2B
Fig.2C

ELECTRONIC COMPONENT MOUNTING BOARD

TECHNICAL FIELD

The present invention relates to an electronic component mounting board.

BACKGROUND

As a configuration in which a passive component is arranged close to an active component such as a semiconductor device used for electronic products such as communication terminals, a configuration in which a semiconductor device is arranged immediately above a capacitor arranged within a circuit board is shown in Japanese Unexamined Patent Publication No. 2003-197809.

SUMMARY

Like the invention described in Japanese Unexamined Patent Publication No. 2003-197809, when a current is supplied to an active component through a circuit board, there is a possibility of an induced magnetic field being generated by the current and noise affecting the active component being generated.

The present invention was made in terms of the foregoing, and an object thereof is to provide an electronic component mounting board capable of suppressing an influence of noise on an active component due to a current flowing along a circuit board.

To achieve the object, an electronic component mounting board according to an aspect of the present invention includes: a circuit board having a wiring layer; a pocket part provided on a main surface of one side of the circuit board; a passive component housed in the pocket part; an active component arranged above the passive component and the main surface of the one side of the circuit board and connected to the passive component; and a shield layer formed of a material containing a magnetic material and provided between a bottom surface of the pocket part and a lower surface of the passive component.

According to the electronic component mounting board, since the shield layer fortified of the material containing the magnetic material is provided between the bottom surface of the pocket part provided on the main surface of the one side of the circuit board and the lower surface of the passive component housed in the pocket part, an induced magnetic field generated by flowing a current in the circuit board can be inhibited from exerting an influence on the passive component and the active component connected to the passive component. Thus, an influence of noise on the active component can be suppressed.

Here, the shield layer may be provided between the bottom surface of the pocket part and a lateral surface of the passive component.

According to the above configuration, the shield layer of the lateral surface can prevent an induced magnetic field generated in the conductor layers of the circuit board arranged on the lateral surface from affecting the passive component and the active component, and an influence of noise on the active component can be further suppressed.

In addition, the shield layer may be provided between the main surface of the one side of the circuit board and the active component.

According to the above configuration, an induced magnetic field generated in the circuit board can be prevented from directly affecting the active component, and an influence of noise on the active component can be further suppressed.

According to the present invention, an electronic component mounting board capable of suppressing an influence of noise on an active component due to a current flowing in a circuit board is provided.

BRIEF DESCRIPTION OF THE DRAWINGS

FIGS. 2A, 2B, and 2C are views illustrating modifications of shapes of a pocket part and a shield layer.

DETAILED DESCRIPTION

Hereinafter, an embodiment for carrying out the present invention will be described with reference to the attached drawings. Note that, in the description of the drawings, the same elements are given the same reference signs, and duplicate description thereof will be omitted.

(Electronic Component Mounting Board)

Figure 1:
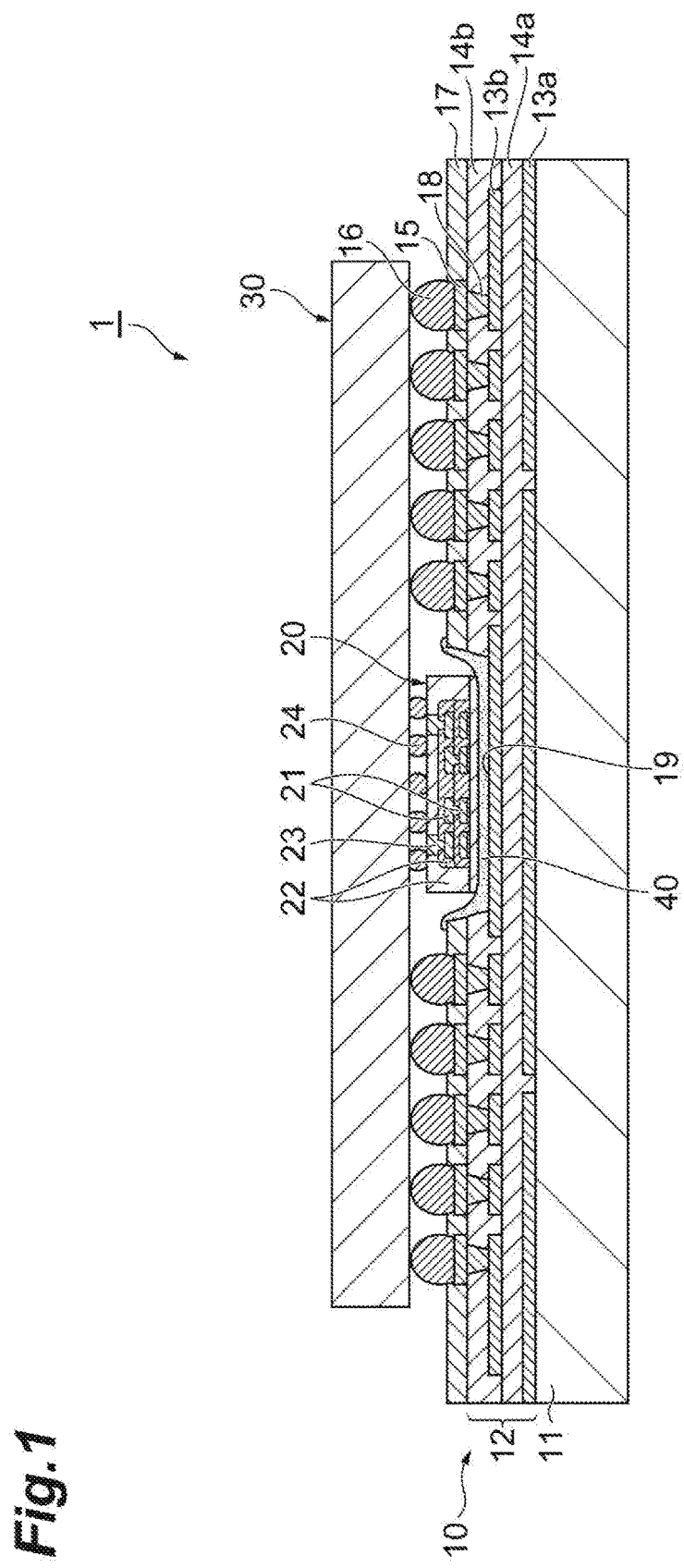
FIG. 1 is a sectional view illustrating a schematic configuration of an electronic component mounting board according to an embodiment of the present invention.

FIG. 1 is a sectional view illustrating a schematic configuration of an electronic component mounting board according to an embodiment of the present invention. As illustrated in FIG. 1, an electronic component mounting board 1 includes a circuit board 10, and a passive component 20 and an active component 30 mounted on the circuit board 10. The passive component 20 is housed in a pocket part 19 provided in a surface of one side of the circuit board 10, and the active component 30 is mounted to cover a surface of the circuit board 10 and a surface of the passive component 20.

The circuit board 10 is a so-called multi-layer circuit board, and includes a base material 11 and a wiring layer 12 that is laminated on a main surface of one side (shown as the upper side) of the base material 11. In the wiring layer 12, conductor layers 13a and 13b formed of copper or the like and insulating layers 14a and 14b formed of a resin or the like are alternately laminated on the base material 11. A plurality of connecting pads 15 are provided at an upper side of the insulating layer 14b, and solder balls 16 for electrical connection with the active component 30 are provided for the plurality of connecting pads 15. An insulating covering layer 17 for covering the surface of the circuit board 10 is provided between the neighboring solder balls 16, and insulation between the neighboring solder balls 16 and insulation between the neighboring connecting pads 15 are secured. Vias 18 formed of a conductor for electrical connection are provided between the connecting pads 15 and the inner conductor layers 13a and 13b and between the conductor layers 13a and 13b.

In FIG. 1, only the wiring layer 12 on the main surface of the one side of the base material 11 is shown, but the wiring layer may also be formed on a main surface of the other side (shown as the lower side). In this case, vias for connection between the conductor layers of the opposite sides of the base material 11 may be separately provided. In this way, a configuration of the circuit board 10 is not particularly limited.

The pocket part 19 is a recess provided in the surface of the circuit board 10. In FIG. 1, the pocket part 19 is formed by opening the covering layer 17 and the insulating layer 14b of the circuit board 10, a bottom surface of the pocket part 19 is formed by the conductor layer 13b. A shield layer 40 is formed on an inner surface (bottom and lateral surfaces) of the pocket part 19. Although details will be described below, the shield layer 40 is a layer including a magnetic material, and has a function of preventing an induced magnetic field generated in the circuit board 10 from being formed at the passive component 20 side.

The passive component 20 is provided in the pocket part 19 in a state in which it is covered with the shield layer 40. The passive component 20 is connected to the active component 30, and is also connected to the conductor layers 13a and 13b inside the circuit board 10.

The passive component 20 includes, for instance, a resistor, a capacitor, an inductor, and so on. In the electronic component mounting board 1 illustrated in FIG. 1, the inductor is mounted as the passive component 20. The passive component 20 illustrated in FIG. 1 has coil conductors 21 that are laminated in two layers in a thickness direction, and an insulating layer 22 that is formed between and around the coil conductors 21 of the two layers. The passive component 20 has lead-out electrodes 23 that are electrically connected to the coil conductor 21 of the upper layer side, and connecting terminals 24 that are electrically connected to the lead-out electrodes 23. The connecting terminals 24 are electrically connected to the active component 30.

The active component 30 includes, for instance, a semiconductor device, a transistor, and so on. When the electronic component mounting board 1 is used for, for instance, a communication terminal, a high-frequency electronic component is properly used as the active component 30. A lower surface of the active component 30 is connected to the solder balls 16 on the circuit board 10 and the connecting terminals 24 of the passive component 20, and a current is input and output to the active component 30 via the solder balls 16 and the connecting terminals 24.

The circuit board 10 in the electronic component mounting board 1 is a structure in which the wiring layer 12 having a thickness of about 60 μm to 180 μm is provided on the base material 11. In addition, the conductor layers 13a and 13b have a thickness of about 5 μm to 30 μm, and the insulating layers 14a and 14b have a thickness of about 10 μm to 100 μm. The passive component 20 has a thickness of about 50 μm to 100 μm, and the active component 30 has a thickness of about 80 μm to 800 μm. The number and wiring of the conductor layers 13a and 13b in the circuit board 10, configurations and wiring of the passive component 20 and the active component 30, etc. can be appropriately changed.

Here, the pocket part 19 and the shield layer 40 inside the pocket part 19 will be described. The passive component 20 is arranged in the pocket part 19, and the active component 30 is arranged above the passive component 20. Thereby, the passive component 20 and the active component 30 can be arranged close to each other. When the passive component 20 is configured to be housed in the pocket part 19, the active component 30 and the circuit board 10 can also be arranged close to each other, and the circuit board 10 and the passive component 20 can also be arranged close to each other.

Therefore, the pocket part 19 is provided, so that a conductive circuit for connecting the electronic component and the circuit can be shortened, and a power source or the like can be stably supplied to the active component 30.

The shield layer 40 formed inside the pocket part 19 is formed of a material containing a magnetic material. The material containing the magnetic material includes, for instance, iron, a nickel alloy, silicon steel, permalloy, sendust, permendur, soft ferrite, and so on. This material is a so-called soft magnetic material. When the soft magnetic material is used as the shield layer 40, a magnetic field can be prevented from being formed across the shield layer 40 in the electronic component mounting board 1. When used as the material containing the magnetic material used for the shield layer 40, the soft magnetic material is preferably contained at 50% or more in relation to total mass. The balance of the shield layer 40 may contain: a thermosetting resin such as an epoxy resin, a phenol resin, a urethane resin, a silicon resin, a polyimide resin, or the like; or an inorganic filler such as silica, alumina, silicon nitride, or the like. Further, another material containing the magnetic material used for the shield layer 40 includes a metal thin film formed of nickel, copper, or aluminum.

The shield layer 40 provided in the pocket part 19 functions as a magnetic shield between the passive component 20 inside the shield layer 40 in the pocket part 19 and the circuit board 10 outside the shield layer 40. The magnetic shield is formed and thereby, even when an induced magnetic field is generated by the wiring layer 12 or the like in the circuit board 10, the passive component 20 can be inhibited from being affected by the magnetic field.

The active component 30 is more easily affected by an induced magnetic field than the passive component 20, but the passive component 20 functions as a noise filter in a front stage of the active component 30 in many cases. For this reason, it is preferable for the passive component 20 itself not to be affected by an induced magnetic field. Therefore, the shield layer 40 is preferably provided between the passive component 20 and the wiring layer 12 and between the active component 30 and the wiring layer 12. Accordingly, when the shield layer 40 can be formed in a larger size, for example if the entire surface of the circuit board 10 which is close to the active component 30 is covered with the shield layer 40, a possibility of the active component 30 being affected by a magnetic field is further reduced.

However, in practice, since the active component 30 and the circuit board 10 also need to be electrically connected, it is difficult to cover the entire surface of the circuit board 10 with the shield layer 40. In contrast, the bottom surface of the pocket part 19 has a larger area than the lateral surface, and there is a high possibility of the passive component 20 being affected by a magnetic field via the bottom surface of the pocket part 19. Therefore, to make the shield layer 40 exert magnetic shield performance, at least the bottom surface of the pocket part 19 which is included in the inner surface of the pocket part 19 is preferably covered by the shield layer 40, that is, the shield layer 40 is preferably provided between the bottom surface of the pocket part 19 and the lower surface of the passive component 20. When the shield layer 40 is formed on both of the bottom surface and the lateral surface of the pocket part 19, that is, when the shield layer 40 is provided between the lateral surface of the pocket part 19 and a lateral surface of the passive component 20, an influence of the magnetic field from the circuit board 10 can be greatly reduced. In FIG. 1, the example in which the shield layer 40 is formed on the bottom surface and the lateral surface of the pocket part 19 is shown.

When the shield layer 40 has a thickness of 10 μm or more, the shield layer 40 favorably functions as the magnetic shield. Increasing the thickness of the shield layer 40 above 120 μm is not considered to improve the function of the magnetic shield. Therefore, the thickness of the shield layer 40 is preferably set to a range from about 10 μm to 120.

(Modifications)

The shape of the pocket part 19 and the shape of the shield layer 40 can be appropriately changed. Here, modifications of the shapes of the pocket part 19 and the shield layer 40 will be described with reference to FIGS. 2A to 2C.

In FIG. 2A, a member in which a passive component 20 and an active component 30 are integrated and a circuit board 10A in which a pocket part 19A and a shield layer 40A are formed are shown in a separated state. In the circuit board 10A, a structure or the like of a wiring layer 12 is the same as in the circuit board 10 illustrated in FIG. 1. In the circuit board illustrated in FIG. 2A, a shape of the pocket part 19A is the same as the example illustrated in FIG. 1. However, the shield layer 40A is provided on a bottom surface of the pocket part 19A, and the insulating layer 14b and a covering layer 17 are exposed on a lateral surface of the pocket part 19A. Even in this configuration, as described above, the influence of the magnetic field from the bottom surface side of the pocket part 19A can be reduced.

In a circuit board 10B illustrated in FIG. 2B, a pocket part 19B is formed by opening a covering layer 17, an insulating layer 14b, and a conductor layer 13b of the circuit board 10B, and a bottom surface of the pocket part 19B is formed by an insulating layer 14a. The shield layer 40B is formed to cover the insulating layer 14a of a bottom surface thereof, the covering layer 17 of a lateral surface thereof, the insulating layer 14b, and the conductor layer 13b.

In a circuit board 10C illustrated in FIG. 2C, a pocket part 19C is formed by opening a covering layer 17 of the circuit board 10C, and a bottom surface of the pocket part 19C is formed by an insulating layer 14b. A shield layer 40C is formed to cover an insulating layer 14b of a bottom surface thereof, and the covering layer 17 of a lateral surface thereof.

In this way, a depth of the pocket part 19 can be appropriately changed. The shield layer 40 is formed only on the bottom surface of the pocket part 19. However, it can be appropriately changed whether the shield layer 40 is formed on the lateral surface of the pocket part 19.

Figure 3A:
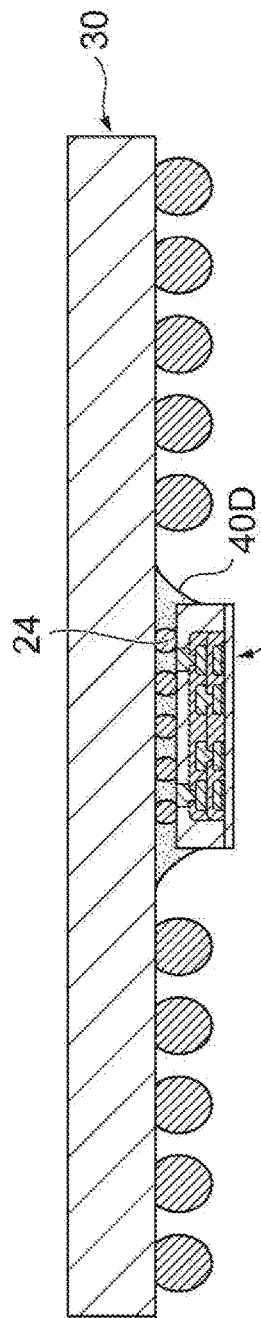
FIGS. 3A, 3B, and 3C are views illustrating the modifications of the shapes of the pocket part and the shield layer.
Figure 3B:
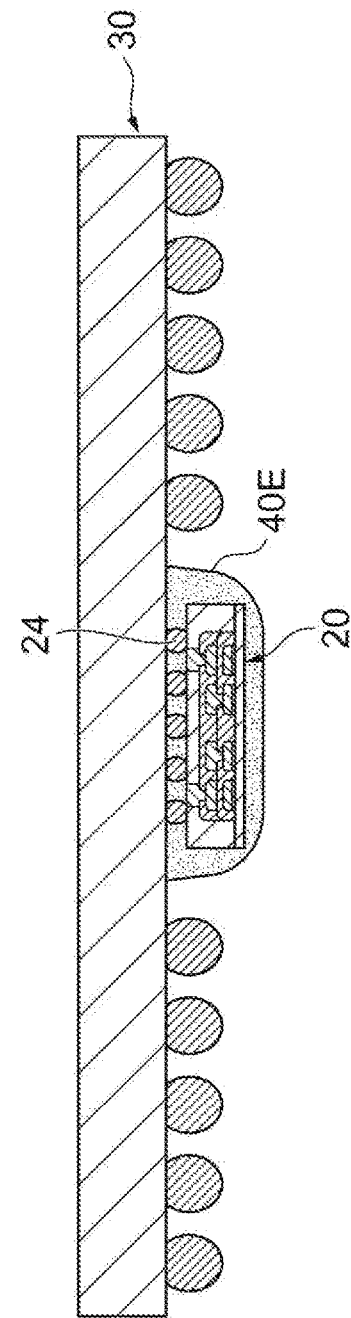
Figure 3C:
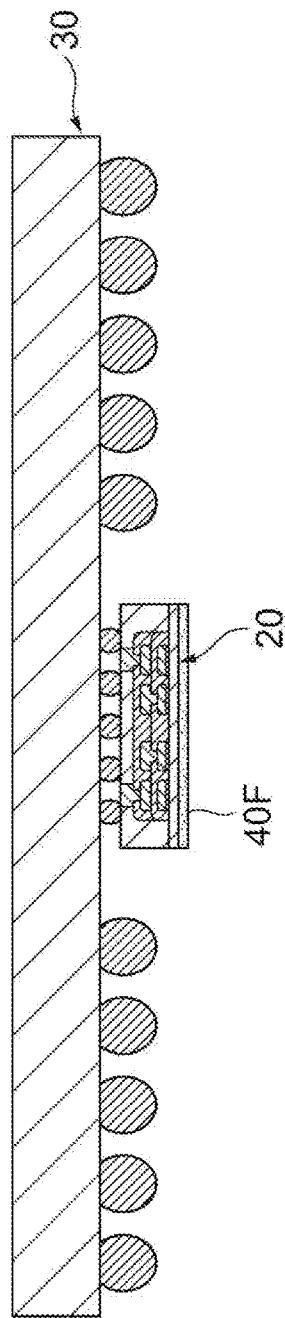

Further, modifications of the pocket part 19 and the shield layer 40 will be described with reference to FIGS. 3A to 3C. In the examples illustrated in FIGS. 1 and 2, the shield layer 40 is formed to cover the bottom surface (and the lateral surface) of the pocket part 19. The shield layer 40 does not need to be integrated with the pocket part 19, and can be formed between the lower surface (and the lateral surface) of the passive component 20 and the circuit board 10. That is, the shield layer 40 can be provided in a state in which it is separated from the pocket part 19. In FIGS. 3A to 3C, an example in which the shield layer 40 is provided at the passive component 20 side is shown.

FIG. 3A illustrates an example in which a passive component 20 and an active component 30 are integrated into a laminate via connecting terminals 24 and a shield layer 40D is formed between the passive component 20 and the active component 30 to cover the connecting terminals 24. However, as illustrated in FIG. 3A, when the shield layer 40D is only provided around the connecting terminals 24, the configuration of the passive component 20 is easily affected by a magnetic field from a circuit board 10, and thus a combination with the circuit board in which the shield layer 40 is also formed in the pocket part 19 illustrated in FIG. 1 or FIGS. 2A to 2C is preferable.

FIG. 3B illustrates an example in which a passive component 20 and an active component 30 are integrated into a laminate via connecting terminals 24 and a shield layer 40E is formed to cover the passive component 20 as well as the peripheries of the connecting terminals 24 between the passive component 20 and the active component 30. In this way, when the shield layer 40E is formed to cover the passive component 20, an influence of a magnetic field on the passive component 20 can be suppressed even if the shield layer is separately provided in the pocket part 19 of the circuit board 10.

FIG. 3C illustrates an example in which a passive component 20 and an active component 30 are integrated into a laminate via connecting terminals 24 and a shield layer 40F is formed to cover a lower surface of the passive component 20. In this way, even when the shield layer 40F is formed to cover the lower surface of the passive component 20, an influence of a magnetic field on the passive component 20 can be suppressed even if the shield layer is separately provided in the pocket part 19 of the circuit board 10. However, when the passive component 20 is housed in the pocket part 19, the passive component 20 is considered to be affected by a magnetic field from a lateral surface of the pocket part 19. Thus, the shield layer is separately provided on the lateral surface of the pocket part 19, and thereby an influence of the magnetic field can be further reduced.

As illustrated in FIGS. 3A to 3C, when the shield layer is formed with respect to the laminate in which the passive component 20 and the active component 30 are integrated via the connecting terminals 24, the laminate can be manufactured by a method of, for instance, adhering the laminate to a soft magnetic material or the like serving as a material of the shield layer and then thermosetting the laminate. To be specific, for example, a composite resin in which a magnetic filler such as ferrite and an uncured thermosetting resin are mixed at a given ratio is applied to the laminate and is pressed against the laminate. Afterwards, the entire laminate is heated to thermoset the composite resin in the uncured state. As the thermosetting resin, an epoxy resin, a phenol resin, a urethane resin, a silicon resin, a polyimide resin, or the like can be favorably used.

In addition, a method of covering the laminate with the thermosetting resin and forming the shield layer on a surface of the laminate can be adopted. In this case, a paint in which powder of a magnetic material is dispersed on a surface of the thermosetting resin shield layer may be applied and dried, or a shield layer formed of a magnetic thin film may be formed by a sputtering method or a vapor deposition method. In this case, a Ni thin film or a soft ferrite thin film can be favorably used.

(Method of Forming Pocket Part and Shield Layer)

Next, three methods of forming the pocket part 19 and the shield layer 40 in the circuit board 10 as illustrated in FIG. 1 or FIGS. 2A to 2C will be described with reference to FIGS. 4 to 6, but the invention is not limited thereto. In FIGS. 4 to 6, the base material 11 of the circuit board 10 is not shown.

FIGS. 4A to 4D are sectional views illustrating a first method of forming the pocket part 19 and the shield layer 40. For the first method, a case in which the pocket part is formed at positions corresponding to the covering layer 17 and the insulating layer 14b will be described.

Figure 4A:
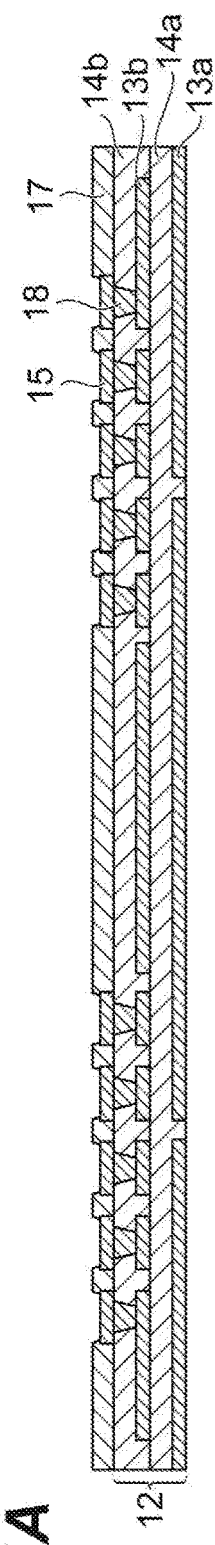
FIGS. 4A, 4B, 4C, and 4D are views illustrating a method of forming the pocket part and the shield layer in a circuit board.

First, as illustrated in FIG. 4A, a board is prepared by laminating a conductor layer 13a, an insulating layer 14a, a conductor layer 13b, and an insulating layer 14b, which act as a wiring layer 12, on a base material 11 (not shown) in this order, forming vias 18, providing connecting pads 15 on the vias 18, and covering the periphery of the connecting pads 15 with a covering layer 17. To manufacture the board, a well-known method can be used. At this point in time, the covering layer 17 is faulted in a region in which the pocket part 19 is to be formed.

Figure 4B:
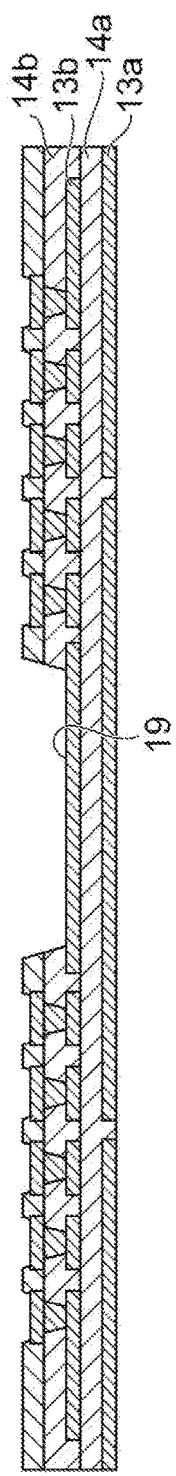

Next, an opening corresponding to the pocket part is formed by laser processing. Afterwards, desmear is performed, and thereby the pocket part 19 is formed as illustrated in FIG. 4B.

Figure 4C:
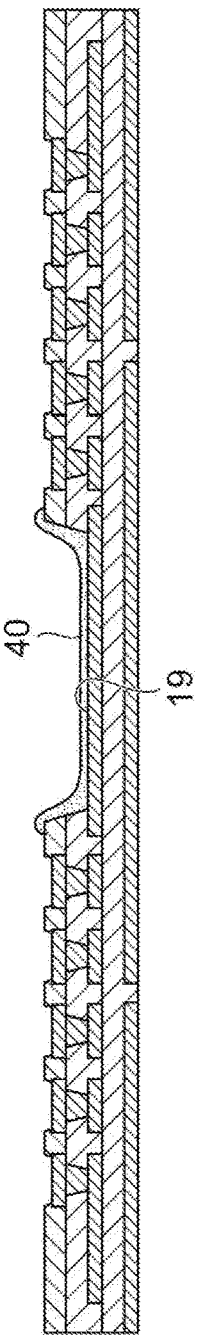

Afterwards, surface treatment (NiPdAu plating or the like) for forming a shield layer containing a magnetic material is performed. Then, a material of the shield layer 40 is disposed inside the pocket part 19 by a method such as inkjet coating or printing, and thermosetting treatment is performed. Thereby, the shield layer 40 illustrated in FIG. 4C is formed. Heating conditions or the like of the thermosetting treatment are appropriately set depending on the material or a thickness of the shield layer 40.

Figure 4D:
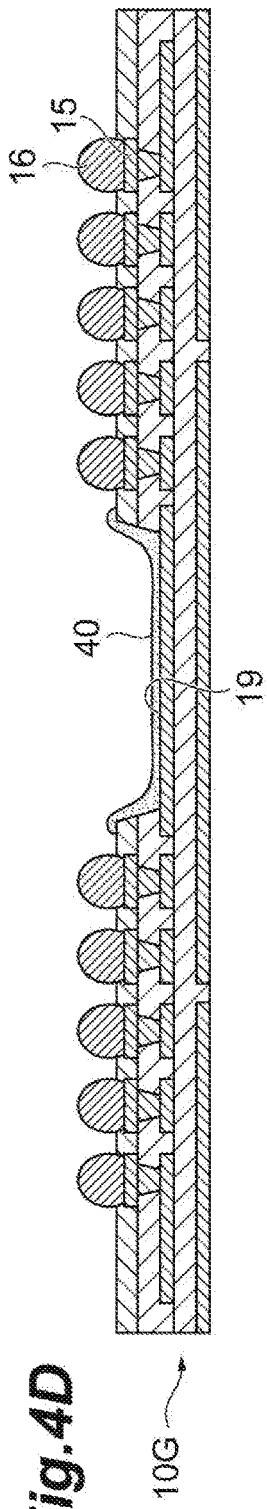

Afterwards, solder balls 16 are formed on connecting pads 15. Thereby, as illustrated in FIG. 4D, a circuit board 10G in which the shield layer 40 is formed in the pocket part 19 can be manufactured.

FIGS. 5A to 5E are sectional views illustrating a second method of forming the pocket part 19 and the shield layer 40. For the second method, a case in which the pocket part is formed at positions corresponding to the covering layer 17, the insulating layer 14b, and the conductor layer 13b will be described.

Figure 5A:
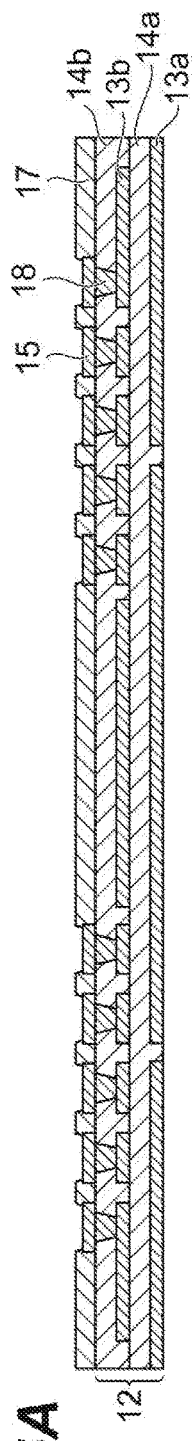
FIGS. 5A, 5B, 5C, 5D, and 5E are views illustrating a method of forming the pocket part and the shield layer in the circuit board.

First, as illustrated in FIG. 5A, a board is prepared by laminating a conductor layer 13a, an insulating layer 14a, a conductor layer 13b, and an insulating layer 14b, which act as a wiring layer 12, on a base material 11 (not shown) in this order, forming vias 18, providing connecting pads 15 on the vias 18, and covering the periphery of the connecting pads 15 with a covering layer 17. This board is the same as that illustrated in FIG. 4A, and the covering layer 17 is formed in a region in which the pocket part 19 is to be formed.

Figure 5B:
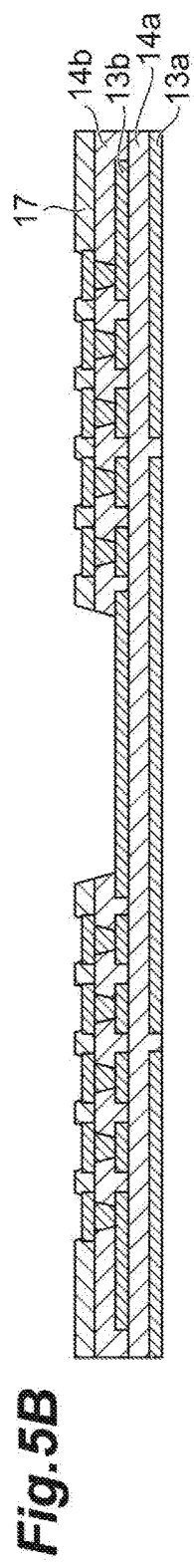
Figure 5C:
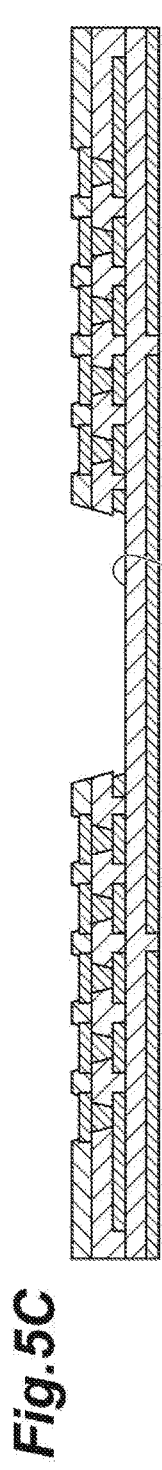

Next, as illustrated in FIG. 5B, an opening passing through the covering layer 17 and the insulating layer 14b is formed by laser processing. Further, only the conductor layer 13b inside the opening is removed by etching. As a result, as illustrated in FIG. 5C, the pocket part 19 from which the conductor layer 13b is also removed is formed.

Figure 5D:
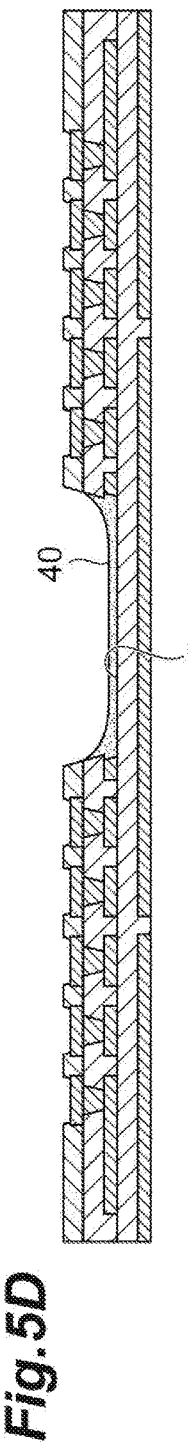

Afterwards, a material of the shield layer 40 is disposed inside the pocket part 19 by a method such as inkjet coating or printing, and thermosetting treatment is performed. Thereby, the shield layer 40 illustrated in FIG. 5D is formed. Heating conditions or the like of the thermosetting treatment are appropriately set depending on the material of the shield layer 40. In FIG. 5D, an example in which the shield layer 40 is formed only on a bottom surface of the pocket part 19 and its periphery is shown. When the conductor layer 13b is removed to form the pocket part 19, an end face of the conductor layer 13b is preferably covered with the shield layer 40.

Figure 5E:
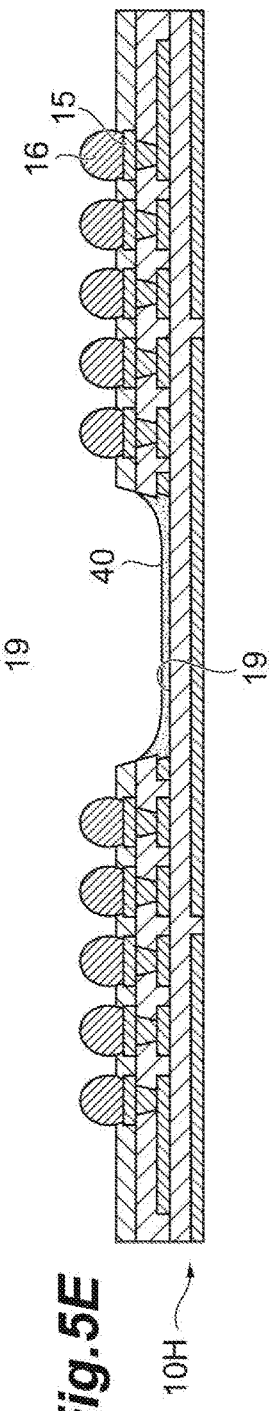

Afterwards, solder balls 16 are formed on connecting pads 15. Thereby, as illustrated in FIG. 5E, a circuit board 10H in which the shield layer 40 is formed in the pocket part 19 can be manufactured.

Figure 6A:
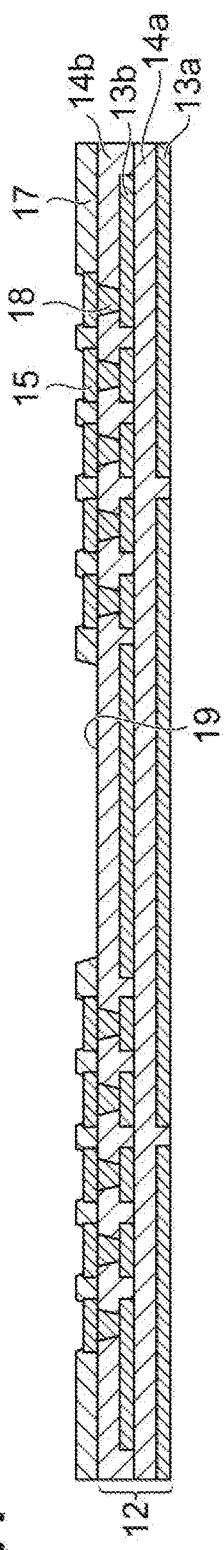
FIGS. 6A, 6B and 6C are views illustrating a method of forming the pocket part and the shield layer in the circuit board.
Figure 6B:
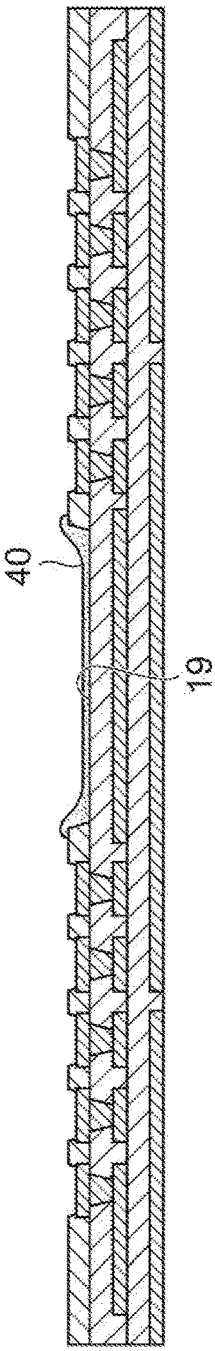
Figure 6C:
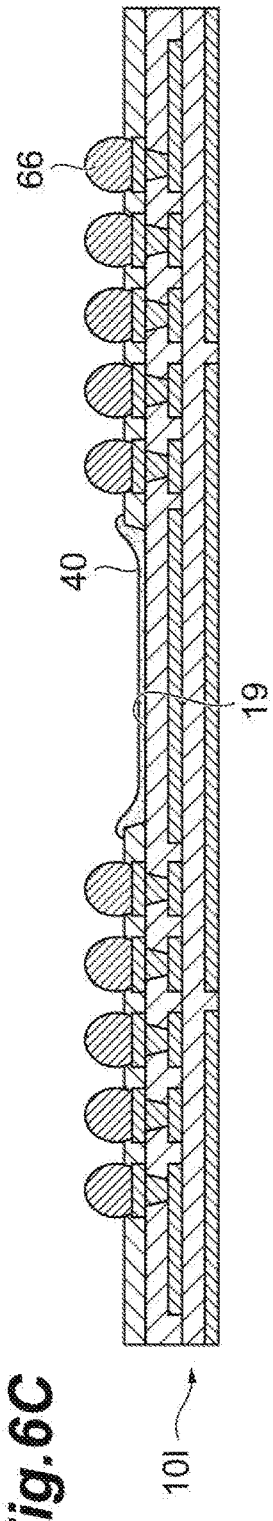

FIGS. 6A to 6C are sectional views illustrating a third method of forming the pocket part 19 and the shield layer 40. For the third method, a case in which the pocket part is formed at a position corresponding to the covering layer 17 will be described.

First, as illustrated in FIG. 6A, a board is prepared by laminating a conductor layer 13a, an insulating layer 14a, a conductor layer 13b, and an insulating layer 14b, which act as a wiring layer 12, on a base material 11 (not shown) in this order, forming vias 18, providing connecting pads 15 on the vias 18, and covering the periphery of the connecting pads 15 with a covering layer 17. This board has the same configuration as those illustrated in FIGS. 4A and 5A, except that the covering layer 17 is not formed in a region in which the pocket part 19 is to be formed. That is, after the lamination of the insulating layer 14b, the covering layer 17 is not previously laminated on the insulating layer 14b, and thereby the pocket part 19 is formed.

Next, a material of the shield layer 40 is disposed inside the pocket part 19 by a method such as inkjet coating or printing, and thermosetting treatment is performed. Thereby, the shield layer 40 illustrated in FIG. 6B is formed. Heating conditions or the like of the thermosetting treatment are appropriately set depending on the material of the shield layer 40.

Afterwards, solder balls 16 are formed on connecting pads 15. Thereby, as illustrated in FIG. 6C, a circuit board 10I in which the shield layer 40 is formed in the pocket part 19 can be manufactured.

As described above, according to the electronic component mounting board 1 related to the present embodiment, since the shield layer 40 formed of the material containing the magnetic material is provided between the bottom surface of the pocket part 19 provided on the main surface of the one side of the circuit board 10 and the lower surface of the passive component 20 housed in the pocket part 19, the induced magnetic field generated by flowing a current in the circuit board 10 can be inhibited from exerting an influence on the passive component 20 and the active component 30 connected to the passive component 20. Thus, an influence of noise on the active component 30 that is easily affected by a magnetic field can be particularly suppressed.

When the shield layer 40 is also provided between the lateral surface of the shield layer 40 and the lateral surface of the passive component 20, an influence on the passive component 20 and the active component 30 due to the induced magnetic field generated in the conductor layers 13a and 13b of the circuit board 10 arranged on the lateral surface of the passive component 20 can be prevented by the shield layer 40 of the lateral surface. Therefore, an influence of noise on the active component 30 can be further suppressed.

Further, when the shield layer 40 is also provided between the main surface of the one side of the circuit board 10 and the active component 30, the induced magnetic force generated in the circuit board 10 can be prevented from directly affecting the active component 30, and an influence of noise on the active component 30 can be further suppressed.

While embodiments of the present invention have been described, the present invention is not necessarily limited to the above embodiments, and can be modified in various ways without departing from the spirit of the invention.

For example, in the circuit board 10 included in the electronic component mounting board 1 described in the embodiments, the arrangement or the like of the conductor layers 13a and 13b in the wiring layer 12 can be appropriately changed. The connection between the circuit board 10 and the active component 30, the connection between the circuit board 10 and the passive component 20, etc. can also be appropriately changed. Therefore, wiring for the connection between the circuit board 10 and the passive component 20 may be formed, for instance, by the conductor passing through the opening provided in the shield layer 40.

What is claimed is:

1. An electronic component mounting board comprising:
   a circuit board having (1) a wiring layer that includes a first insulating layer, a second insulating layer, and a conductor layer between the first insulating layer and the second insulating layer and (2) a recess in a main surface of one side of the circuit board, the main surface being on a same side of the conductor layer as the first insulating layer;
   a passive component located in the recess;
   an active component arranged above the passive component and the main surface of the one side of the circuit board and connected to the passive component; and
   a shield layer formed of a material containing a magnetic material and provided between a bottom surface of the recess and a lower surface of the passive component;
   wherein the recess extends through the first insulating layer and the conductor layer such that the bottom surface of the recess is the second insulating layer.

2. The electronic component mounting board according to claim 1, wherein the shield layer is provided between the bottom surface of the recess and a lateral surface of the passive component.

3. The electronic component mounting board according to claim 1, wherein the shield layer is provided between the main surface of the one side of the circuit board and the active component.

4. The electronic component mounting board according to claim 1, wherein the lower surface of the passive component is received entirely within the recess and is below the main surface.

5. An electronic component mounting board comprising:
   a circuit board having (1) a wiring layer that includes an insulating layer and a conductor layer and (2) a recess in a main surface of one side of the circuit board, the main surface being on the opposite side of the conductor layer from the insulating layer;
   a passive component located in the recess;
   an active component arranged above the passive component and the main surface of the one side of the circuit board and connected to the passive component; and
   a shield layer formed of a material containing a magnetic material and provided between a bottom surface of the recess and a lower surface of the passive component;
   wherein the recess extends through the conductor layer such that the bottom surface of the recess is the insulating layer.

* * * * *